United States Patent
Moon et al.

(10) Patent No.: US 12,126,326 B2
(45) Date of Patent: Oct. 22, 2024

(54) FILM BULK ACOUSTIC RESONATOR

(71) Applicant: WISOL CO., LTD., Gyeonggi-do (KR)

(72) Inventors: A Young Moon, Gyeonggi-do (KR); Chul Hwa Lee, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 301 days.

(21) Appl. No.: 17/743,585

(22) Filed: May 13, 2022

(65) Prior Publication Data

US 2022/0385268 A1 Dec. 1, 2022

(30) Foreign Application Priority Data

May 31, 2021 (KR) .......................... 10-2021-0069701

(51) Int. Cl.
*H03H 9/17* (2006.01)
*H03H 9/13* (2006.01)

(52) U.S. Cl.
CPC ............ *H03H 9/173* (2013.01); *H03H 9/131* (2013.01)

(58) Field of Classification Search
CPC .............................. H03H 9/173; H03H 9/131
See application file for complete search history.

(56) References Cited

U.S. PATENT DOCUMENTS

| 2015/0349747 A1 | 12/2015 | Burak et al. |
| 2019/0123708 A1* | 4/2019 | Choy ....................... H03H 3/02 |
| 2021/0143792 A1* | 5/2021 | Pollard ................ H03H 9/0211 |
| 2022/0052664 A1* | 2/2022 | Schiek ............... H03H 9/02118 |

FOREIGN PATENT DOCUMENTS

| JP | 2005-198233 A | 7/2005 |
| KR | 10-2005-0034052 A | 4/2005 |
| KR | 10-2020-0064864 A | 6/2020 |

OTHER PUBLICATIONS

Office Action from corresponding Korean Application No. 10-2021-0069701, dated Aug. 9, 2023.

* cited by examiner

*Primary Examiner* — Samuel S Outten
(74) *Attorney, Agent, or Firm* — Harness, Dickey & Pierce, P.L.C.

(57) ABSTRACT

Disclosed is a film bulk acoustic resonator (FBAR) including a substrate, a lower electrode formed above the substrate, a piezoelectric layer formed above the lower electrode, an upper electrode formed above the piezoelectric layer, and a first protection layer formed above the upper electrode. Here, the first protection layer covers the upper electrode while extending downward along a side surface of one end of the upper electrode to cover a certain area of the piezoelectric layer.

3 Claims, 3 Drawing Sheets

FILM BULK ACOUSTIC RESONATOR

CROSS-REFERENCE TO RELATED APPLICATION

This application claims the benefit of Korean Patent Application No. 10-2021-0069701, filed on May 31, 2021, in the Korean Intellectual Property Office, the disclosure of which is incorporated herein in its entirety by reference.

FIELD

The present invention relates to a resonator used for communication in a radio frequency (RF) band, and more particularly, to a film bulk acoustic resonator (FBAR).

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (hereinafter, referred to as SAW) filter have been used most as RF filters for wireless communication. The dielectric filter has advantages such as a high dielectric constant, a low insertion loss, stability at a high temperature, high vibration resistance, and high shock resistance. However, the dielectric filter has a limitation in miniaturization and monolithic microwave integrated circuit (MMIC) which are recent trends of technology development. Also, the SAW filter has a small size in comparison to the dielectric filter, easily processes a signal, has a simple circuit, and is manufactured using a semiconductor process so as to facilitate mass production. Also, the SAW filter has an advantage of transmitting and receiving high-grade information due to high side rejection within a passband in comparison to the dielectric filter. However, since an SAW filter process includes an exposure process using ultraviolet (UV), there is a disadvantage in which a line width of an interdigital transducer (IDT) has a limitation of about 0.5 μm. Accordingly, there is a problem in which it is impossible to cover an ultrahigh frequency band of 3 GHz or more using the SAW filter. Basically, there is a difficulty in forming an MMIC structure and a single chip on a semiconductor substrate.

In order to overcome such limitations and problems, a film bulk acoustic resonator (FBAR) filter integrated with other active devices on an existing semiconductor (Si or GaAs) substrate to completely implement a frequency control circuit as an MMIC is provided.

The FBAR is a thin film device which is low-cost, small-sized, and features high quality coefficient so as to be applicable to a wireless communication device, a military-use radar, and the like in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, it is apparent that the FBAR is one of most adequate devices for an MMIC which requires high stability and a high quality coefficient.

An FBAR filter is formed by depositing zinc oxide (ZnO), aluminum nitride (AlN), or the like which is a piezoelectric-dielectric material on silicon (Si) or gallium arsenide (GaAs) which is a semiconductor substrate using an RF sputtering method and causes resonation due to a piezoelectric property. That is, the FBAR is formed by depositing a piezoelectric film between both electrodes and generates resonance by causing a bulk acoustic wave.

A variety of forms of FBAR structures have been studied until now. In the case of a membrane type FBAR, a silicon oxide ($SiO_2$) film is deposited on a substrate and a membrane layer is formed using a cavity formed through isotropic etching on an opposite side of the substrate. Also, a lower electrode is formed above the $SiO_2$ film, a piezoelectric layer is formed by depositing a piezoelectric material above the lower electrode using an RF magnetron sputtering method, and an upper electrode is formed above the piezoelectric layer.

The above membrane type FBAR has an advantage of less power loss and dielectric loss due to the cavity. However, the membrane type FBAR has problems in which a device-occupied area is large due to a directivity of the silicon substrate and a decrease in yield caused by damages due to low structural stability in a follow-up packaging process. Accordingly, recently, in order to reduce a loss caused by the membrane and to simplify a device manufacturing process, a Bragg reflector type FBAR is sometimes used.

However, in the case of conventional FBARs, there is a high possibility that one side of an upper electrode may be damaged in a following process while an FBAR is manufactured. Also, there is a risk that foreign matter or moisture may permeate into an air gap formed between the upper electrode and the piezoelectric layer, and thus a set resonance frequency varies due to the permeation of foreign matter or moisture.

RELATED ART DOCUMENT

[Patent Document]
Patent Document 0001: Korean Patent Publication No. 10-2005-0034052 (published on Apr. 14, 2005)

SUMMARY

The present invention is directed to providing a film bulk acoustic resonator (FBAR) including a non-cantilever structure configured to protect an upper electrode included in the FBAR.

According to an aspect of the present invention, there is provided a film bulk acoustic resonator (FBAR) including a substrate, a lower electrode formed above the substrate, a piezoelectric layer formed above the lower electrode, an upper electrode formed above the piezoelectric layer, and a first protection layer formed above the upper electrode. Here, the first protection layer covers the upper electrode while extending downward along a side surface of one end of the upper electrode to cover a certain area of the piezoelectric layer.

The first protection layer may include one or more dielectric materials of $SiO_x$ and $SiN_x$ (here, x is a positive real number greater than 0).

The first protection layer may seal an air gap formed between a lower end of the one end of the upper electrode and the piezoelectric layer.

The first protection layer may have a layer thickness for covering the piezoelectric layer which is at least greater than a gap height of the air gap.

The FBAR may further include a second protection layer which is formed between the first protection layer and the upper electrode and covers the upper electrode.

The second protection layer may include one or more dielectric materials of $AlN_x$, $SiO_x$, and $SiN_x$ (here, x is a positive real number greater than 0).

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Hereinafter, exemplary embodiments of the present invention will be described in detail with reference to the attached drawings.

The embodiments of the present invention are provided to more completely explain the present invention to one of ordinary skill in the art. The embodiments of the present invention may be changed in a variety of shapes, and the scope of the present invention is not limited to the following embodiments. The embodiments are provided to make the present disclosure more substantial and complete and to completely transfer the concept of the present invention to those skilled in the art.

The terms used herein are to explain particular embodiments and not intended to limit the present invention. As used herein, singular expressions, unless clearly defined otherwise in context, include plural expressions. Also, as used herein, the term "and/or" includes any and all combinations or one of a plurality of associated listed items. Also, hereinafter, the embodiments of the present invention will be described with reference to the drawings which schematically illustrate the embodiments of the present invention.

Figure 1:
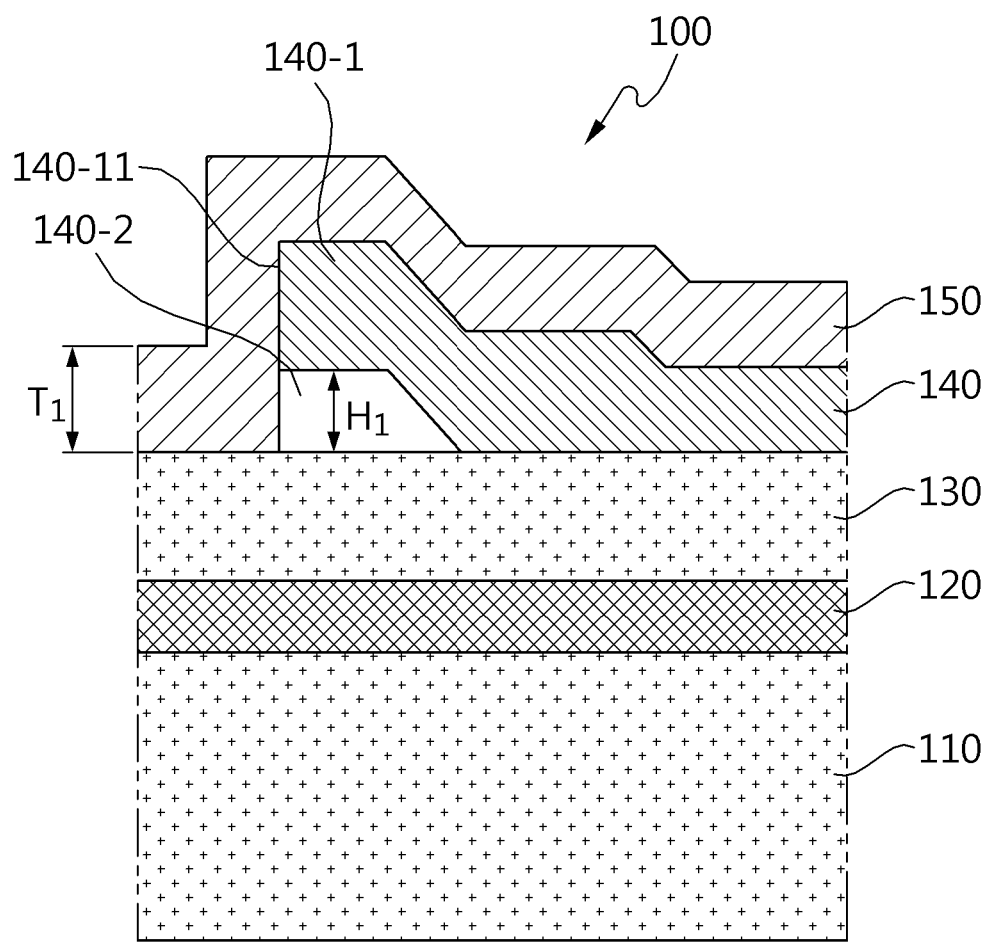
FIG. 1 is a cross-sectional view illustrating a film bulk acoustic resonator (FBAR) according to one embodiment of the present invention.

FIG. 1 is a cross-sectional view illustrating a film bulk acoustic resonator (FBAR) 100 according to one embodiment of the present invention.

Referring to FIG. 1, the FBAR 100 includes a substrate 110, a lower electrode 120, a piezoelectric layer 130, an upper electrode 140, and a first protection layer 150.

When a signal is applied from the outside between the lower electrode 120 and the upper electrode 140, the air-gap type FBAR 100 resonates with respect to a frequency of natural oscillation according to a thickness of the piezoelectric layer 130 while part of electrical energy input and transferred between the two electrodes is converted into mechanical energy according to the piezoelectric effect and the mechanical energy is converted again into electrical energy.

The substrate 110 is a semiconductor substrate and may be a general silicon wafer may be used, and preferably, a high resistivity silicon substrate (HRS). The substrate 110 may include a cavity (not shown) in a certain area. Also, an insulation layer (not shown) may be formed on a top surface of the substrate 100. As the insulation layer, a thermal oxide film which is easily growable on the substrate 100 may be employed or an oxide film or a nitride film formed using a general deposition process such as chemical vapor deposition and the like may be selectively employed.

The cavity is formed by forming an air gap in the substrate 110, forming the insulation layer on the air gap, depositing a sacrificial layer above the insulation layer, performing planarization through etching, and removing the sacrificial layer. Here, the sacrificial layer is formed using a material such as polysilicon, tetraethyl orthosilicate (TEOS), phosphosilicate glass (PSG), and the like, which has excellent surface roughness and is easily formed or removed. As an example, polysilicon which has high surface roughness and is easily formed or removed may be used as the sacrificial layer, and particularly, may be removed using dry etching in a following process.

The lower electrode 120 is formed above the substrate 110. The lower electrode 120 is formed by depositing and patterning a certain material above the substrate 110. A material used for the lower electrode 120 is a general conductive material such as a metal and may preferably include one of aluminum (Al), tungsten (W), gold (Au), platinum (Pt), nickel (Ni), titanium (Ti), chrome (Cr), palladium (Pd), ruthenium (Ru), rhenium (Re), and molybdenum (Mo). The lower electrode 120 may have a thickness of 10 to 1,000 nm.

The piezoelectric layer 130 is formed above the lower electrode 120. The piezoelectric layer 130 may be formed by depositing a piezoelectric material above the lower electrode 120 and patterning the deposited piezoelectric material. The piezoelectric layer 130 may be formed through deposition using a radio frequency (RF) magnetron sputtering method, evaporation method, and the like. The piezoelectric electrode 130 may have a thickness of 5 to 500 nm. Details of the piezoelectric layer 130 will be described below.

The upper electrode 140 is formed above the piezoelectric layer 130. The upper electrode 140 may be formed by depositing a metal film for an upper electrode in a certain area above the piezoelectric layer 130 and patterning the deposited metal film. The upper electrode 140 may be formed using the same material, deposition method, and patterning method as those of the lower electrode 120. The upper electrode 140 may have a thickness of 5 to 1,000 nm.

One end 140-1 of the upper electrode 140 may have a shape having one side which is fixed and another side which is not fixed. The one end 140-1 of the upper electrode 140 is spaced apart and extends from an upper surface of the piezoelectric layer 130 to form an air gap 140-2 between the upper electrode 140 and the piezoelectric layer 130. Due to resonance caused by this structure of the one end 140-1, a lateral wave which escapes from an active area is locked up so as to improve a quality factor. The air gap 140-2 may remain in an air phase or may be filled with a dielectric.

The first protection layer 150 is located above the upper electrode 140. The first protection layer 150 performs a passivation function for protecting the lower electrode 120, the piezoelectric layer 130, and the upper electrode 140.

The first protection layer 150 covers the upper electrode 140 while extending downward along a side surface 140-11 of the one end 140-1 to cover a certain area of the piezoelectric layer 130.

The first protection layer 150 may include a dielectric material such as $SiO_x$, $SiN_x$ (here, x is a positive real number greater than 0), and the like.

The first protection layer 150 extends downward along the side surface 140-11 of the one end 140-1 so as to seal the air gap 140-2 formed between a lower end of the one end 140-1 and the piezoelectric layer 130 and forms a non-cantilever structure in which the upper electrode 140 and the first protection layer 150 are combined. The air gap 140-2 may be filled with a dielectric material instead of air.

The first protection layer 150 may have a layer thickness T1 for covering the piezoelectric layer 130 which is at least greater than a gap height H1 of the air gap 140-2. Since the layer thickness T1 of the first protection layer 150 which covers the piezoelectric layer 130 is greater than the gap height H1 of the air gap 140-2, the durability of the first protection layer 150 for sealing the air gap 140-2 may be secured.

Figure 2:
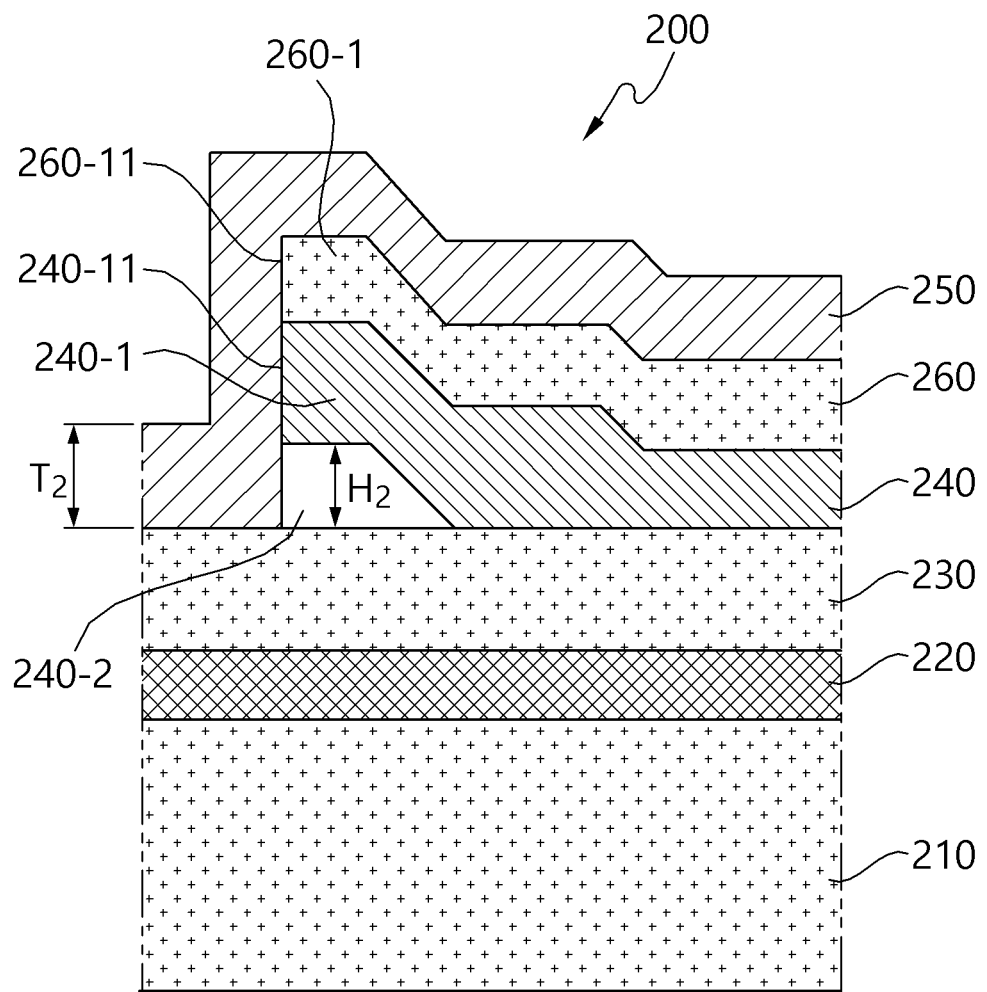
FIG. 2 is a cross-sectional view illustrating an FBAR according to another embodiment of the present invention.

FIG. 2 is a cross-sectional view illustrating an FBAR 200 according to another embodiment of the present invention.

Referring to FIG. 2, the FBAR 200 includes a substrate 210, a lower electrode 220, a piezoelectric layer 230, an upper electrode 240, a first protection layer 250, and a second protection layer 260.

Since the FBAR 200 of FIG. 2 has a structure including the substrate 210, the lower electrode 220, the piezoelectric layer 230, and the upper electrode 240 which correspond to the substrate 110, the lower electrode 120, the piezoelectric layer 130, and the upper electrode 140 of FIG. 1, respectively, hereinafter, the first protection layer 250 and the second protection layer 260 will be mainly described.

For convenience of description, first, the second protection layer 260 will be described.

The second protection layer 260 is formed between the first protection layer 250 and the upper electrode 240 and covers the upper electrode 240. Here, the second protection layer 260 has a structure which covers only an upper surface of the upper electrode 240 and does not extend downward along a side surface 240-11 of one end 240-1 of the upper electrode 240 or cover a certain area of the piezoelectric layer 230.

The second protection layer 260 may include a dielectric material such as $AlN_x$, $SiO_x$, $SiN_x$ (here, x is a positive real number greater than 0), and the like.

The first protection layer 250 is located above the second protection layer 260. The first protection layer 250 performs a passivation function for protecting the lower electrode 220, the piezoelectric layer 230, the upper electrode 240, and the second protection layer 260.

The first protection layer 250 covers the second protection layer 260 while extending downward along a side surface 260-11 of one end 260-1 of the second protection layer 260 and the side surface 240-11 of the one end 240-1 of the upper electrode 240 to cover a certain area of the piezoelectric layer 230.

The first protection layer 250 may include a dielectric material such as $SiO_x$, $SiN_x$ (here, x is a positive real number greater than 0), and the like.

Since the first protection layer 250 extends downward along the side surface 260-11 of the one end 260-1 of the second protection layer 260 and the side surface 240-11 of the one end 240-1 of the upper electrode 240, an air gap 240-2 formed between a lower end of the one end 240-1 of the upper electrode 240 and the piezoelectric layer 230 is sealed.

The first protection layer 250 may have a layer thickness T2 for covering the piezoelectric layer 230 which is at least greater than a gap height H2 of the air gap 240-2. Since the layer thickness T2 of the first protection layer 250 which covers the piezoelectric layer 230 is greater than the gap height H2 of the air gap 240-2, the durability of the first protection layer 250 for sealing the air gap 240-2 may be secured.

Figure 3:
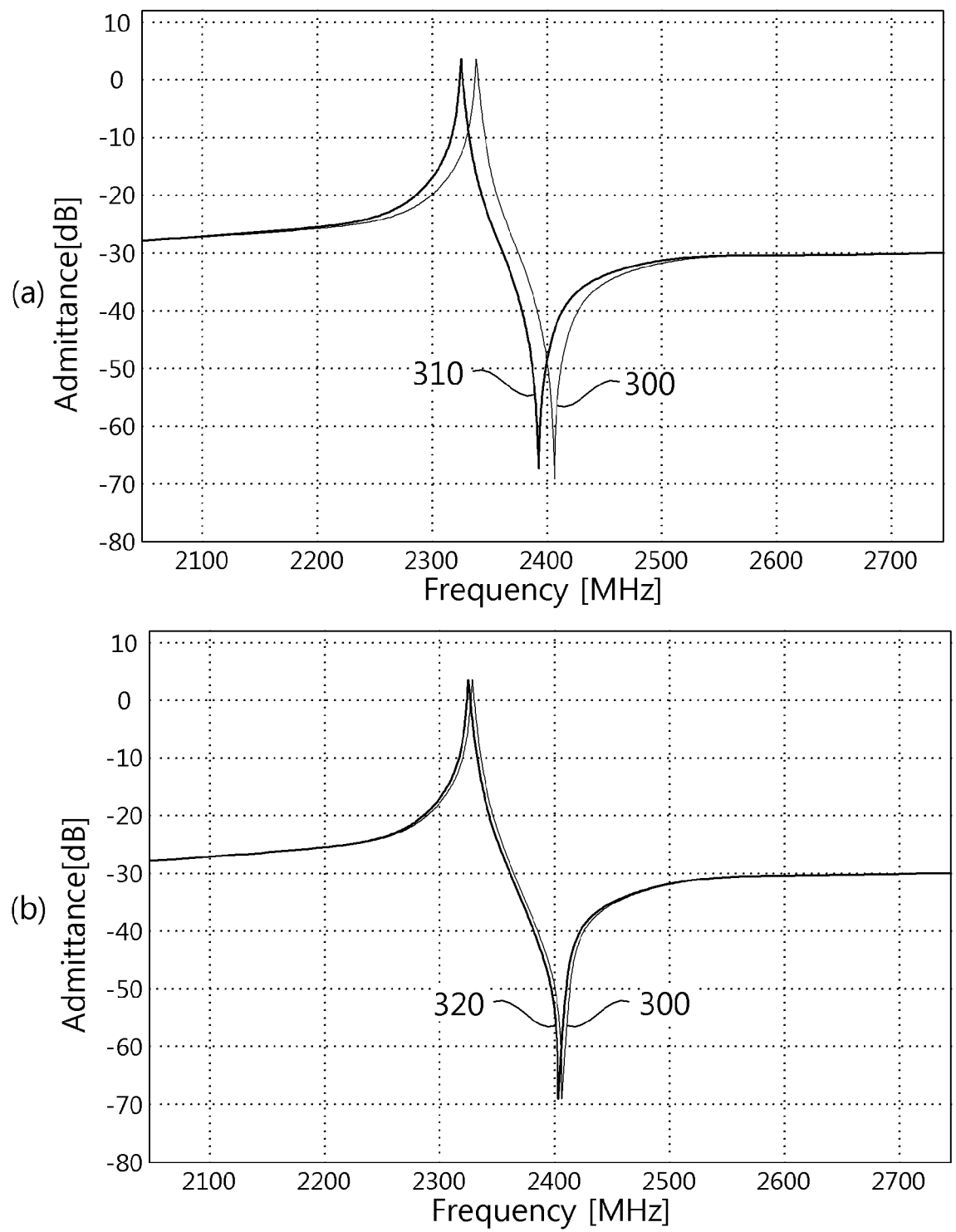
FIGS. 3A and 3B are reference views illustrating frequency variations according to reliability tests on FBARs according to embodiments of the present invention.

FIGS. 3A and 3B are reference views illustrating frequency variations according to reliability tests on FBARs according to embodiments of the present invention.

FIG. 3A is a graph illustrating frequency characteristics of a conventional FBAR in which a protection layer covers only an upper surface of an upper electrode, and FIG. 3B is a graph illustrating frequency characteristics of an FBAR according to the present invention in which a first protection layer covers not only an upper surface of an upper electrode but a side surface of one end of the upper electrode.

In FIG. 3A, considering frequency characteristics obtained by the conventional FBAR, it may be seen that foreign matter or moisture permeates into a conventional open air gap, and thus a real resonant frequency 310 shows frequency characteristics changed from those of a set resonant frequency 300 which is required in the FBAR.

By comparison, in FIG. 3B, considering frequency characteristics obtained by the FBAR 100 or 200 according to the present invention, it may be seen that the air gap 140-2 or 240-2 according to the embodiment of the present invention is sealed by the first protection layer to block permeation of foreign matter or moisture, and thus frequency characteristics of a set resonant frequency 300 which is needed in the FBAR are similar to those of a real resonant frequency 320. The FBAR 100 or 200 according to the present invention has a frequency variation characteristic of 25% or less in comparison to the conventional FBAR.

According to the present invention, since a first protection layer formed above an upper electrode covers the upper electrode while extending downward along an end surface of one side of the upper electrode to cover a certain area of a piezoelectric layer, it is possible to prevent damage to the upper electrode which may occur during a resonator manufacturing process.

Also, since foreign matter or moisture is prevented from permeating into an air gap formed in an end of one side of the upper electrode, it is possible to prevent a real resonance frequency property from varying.

Although the exemplary embodiments of the present invention have been described above, it can be understood by one of ordinary skill in the art that a variety of modifications may be made without departing from the essential characteristics of the present invention. Therefore, the disclosed embodiments should be considered in an explanatory view not in a limitative view. It should be noted that the scope of the present invention is defined in the claims not in the above description and all equivalents thereof are included in the present invention.

What is claimed is:

1. A film bulk acoustic resonator (FBAR) comprising:
   a substrate;
   a lower electrode formed above the substrate;
   a piezoelectric layer formed above the lower electrode;
   an upper electrode formed above the piezoelectric layer; and
   a first protection layer formed above the upper electrode,
   wherein the first protection layer covers the upper electrode while extending downward along a side surface of one end of the upper electrode to cover a certain area of the piezoelectric layer,
   wherein the first protection layer seals an air gap formed between a lower end of the one end of the upper electrode and the piezoelectric layer, wherein the first protection layer has a layer thickness for covering the piezoelectric layer which is at least greater than a gap height of the air gap, and wherein the FBAR further includes a second protection layer formed between the first protection layer and the upper electrode, and the second protection layer covers the upper electrode.

2. The FBAR of claim 1, wherein the first protection layer includes one or more dielectric materials of $SiO_x$ and $SiN_x$ (here, x is a positive real number greater than 0).

3. The FBAR of claim 1, wherein the second protection layer includes one or more dielectric materials of $AlN_x$, $SiO_x$, and $SiN_x$ (here, x is a positive real number greater than 0).

* * * * *